United States Patent
Gandhi et al.

(10) Patent No.: US 9,226,363 B2
(45) Date of Patent: Dec. 29, 2015

(54) ELECTROLUMINESCENT DEVICES HAVING NANOSTRUCTURE-FILM ELECTRODE(S)

(75) Inventors: Shripal Gandhi, Palo Alto, CA (US); Jeffrey Jue, Belmont, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 2070 days.

(21) Appl. No.: 11/944,397

(22) Filed: Nov. 21, 2007

(65) Prior Publication Data

US 2015/0334805 A1    Nov. 19, 2015

Related U.S. Application Data

(60) Provisional application No. 60/867,083, filed on Nov. 22, 2006.

(51) Int. Cl.
| | | |
|---|---|---|
| *H05B 33/26* | (2006.01) | |
| *H05B 33/20* | (2006.01) | |
| *H01L 51/52* | (2006.01) | |
| *H01L 51/00* | (2006.01) | |

(52) U.S. Cl.
CPC ............ *H05B 33/26* (2013.01); *H01L 51/0048* (2013.01); *H01L 51/5203* (2013.01); *H05B 33/20* (2013.01)

(58) Field of Classification Search
None
See application file for complete search history.

(56) References Cited

U.S. PATENT DOCUMENTS

| 5,457,565 | A | * | 10/1995 | Namiki et al. | 359/273 |
|---|---|---|---|---|---|
| 6,833,201 | B2 | * | 12/2004 | Czerw et al. | 428/690 |
| 2005/0280359 | A1 | * | 12/2005 | Liu et al. | 313/504 |
| 2006/0012289 | A1 | * | 1/2006 | Shiang | 313/504 |
| 2006/0118768 | A1 | * | 6/2006 | Liu et al. | 252/500 |
| 2006/0197438 | A1 | * | 9/2006 | Conley, Jr. et al. | 313/503 |
| 2006/0274049 | A1 | * | 12/2006 | Spath et al. | 345/173 |

FOREIGN PATENT DOCUMENTS

WO    WO 2007/061428 A2 *  5/2007

* cited by examiner

*Primary Examiner* — Marie R. Yamnitzky
(74) *Attorney, Agent, or Firm* — Harness, Dickey & Pierce, P.L.C.

(57) ABSTRACT

An electroluminescent (EL) device is described, comprising an EL material, an electrode and nanostructures. The nanostructures may form an interconnected network, and may be employed in the EL material and/or in the electrode. A second electrode is also described, wherein an electric field formed between the two electrodes excites phosphors in the EL material to produce light.

4 Claims, 3 Drawing Sheets

ELECTROLUMINESCENT DEVICES HAVING NANOSTRUCTURE-FILM ELECTRODE(S)

This application claims priority to U.S. Provisional Application No. 60/867,083, filed Nov. 22, 2006 and entitled "ELECTROLUMINESCENT DEVICES HAVING NANOSTRUCTURE-FILM ELECTRODE(S)," which is hereby incorporated by reference.

FIELD OF THE INVENTION

The present invention relates in general to electroluminescent (EL) lamps, and more particularly to an EL lamp comprising at least one network of nanostructures.

BACKGROUND

Electroluminescence (EL) describes the direct conversion of electricity to light. It is the result of radiative recombination of electrons and holes in a material (usually a semiconductor), whereby excited electrons release their energy as photons (i.e., light). Prior to recombination, electrons and holes are separated either as a result of doping of the material to form a p-n junction (e.g., in semiconductor electroluminescent devices such as LEDs) or through excitation by impact of high-energy electrons accelerated by a strong electric field (e.g., as with the phosphors in electroluminescent lamps).

Devices based on the latter, e.g., phosphor-based, electroluminescent mechanism include, but are not limited to, backlights for liquid crystal displays, membrane keypads and a variety of other applications. In such devices, the EL material generally must be enclosed between at least two electrodes, at least one of which should be at least semi-transparent to allow produced light to escape. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some but less than 50% transmission of ambient electromagnetic radiation in relevant wavelengths are said to be "semi-transparent."

Currently, the most commonly used transparent electrodes are transparent conducting oxides (TCOs), specifically indium-tin-oxide (ITO) on glass. However, ITO, with its relatively brittle structure, can be an inadequate solution for many emerging applications (e.g., flexible optoelectronic devices), and the indium component of ITO is rapidly becoming a scarce commodity. Additionally, ITO deposition usually requires expensive, high-temperature sputtering, which can be incompatible with many device process flows. Hence, a more robust, abundant and compatible transparent conductor material is required.

SUMMARY OF INVENTION

The present invention describes nanostructure films. Nanostructures have attracted a great deal of recent attention due to their exceptional material properties. Nanostructures may include, but are not limited to, nanotubes (e.g., single-walled carbon nanotubes (SWNTs), multi-walled carbon nanotubes (MWNTs), double-walled carbon nanotubes (DWNTs), few-walled carbon nanotubes (FWNTs)), other fullerenes (e.g., buckyballs), graphene flakes/sheets, and/or nanowires (e.g., metallic (e.g., Ag, Ni, Pt, Au), semiconducting (e.g., InP, Si, GaN), dielectric (e.g., $SiO_2$, $TiO_2$), organic, inorganic). Nanostructure films may comprise at least one interconnected network of such nanostructures, and may similarly exhibit exceptional material properties. For example, nanostructure films comprising at least one interconnected network of substantially carbon nanotubes (e.g., wherein nanostructure density is above a percolation threshold) can exhibit extraordinary strength and electrical conductivity, as well as efficient heat conduction and substantial optical transparency. As used herein, "substantially" shall mean that at least 40% of components are of a given type.

Specifically, an electroluminescent (EL) device having at least one nanostructure-film electrode is provided. In accordance with one embodiment of the present invention, an EL device comprising transparent carbon nanotube electrodes is provided. Transparent conductive films comprised substantially of randomly distributed single-walled carbon nanotubes (SWNTs) and/or few-walled carbon nanotubes (FWNTs) have been demonstrated as substantially more mechanically robust than ITO films, with comparable electrical properties, making them ideal for high-reliability EL lamps. Moreover, carbon is one of the most abundant elements on Earth.

In accordance with a further embodiment of the present invention, a transparent electrode may comprise not only a nanostructure-film, but another conducting material as well, such as a polymer binder.

In accordance with another embodiment of the present invention, nanostructures may be intercalated with EL material, and/or vice versa. The nanostructures may form an interconnected network.

Other features and advantages of the invention will be apparent from the accompanying drawings and from the detailed description. One or more of the above-disclosed embodiments, in addition to certain alternatives, are provided in further detail below with reference to the attached figures. The invention is not limited to any particular embodiment disclosed.

BRIEF DESCRIPTION OF THE DRAWINGS

The invention is better understood from reading the following detailed description of the preferred embodiments, with reference to the accompanying figures in which.

Features, elements, and aspects of the invention that are referenced by the same numerals in different figures represent the same, equivalent, or similar features, elements, or aspects in accordance with one or more embodiments of the system.

DETAILED DESCRIPTION OF THE PREFERRED EMBODIMENTS

Figure 3:
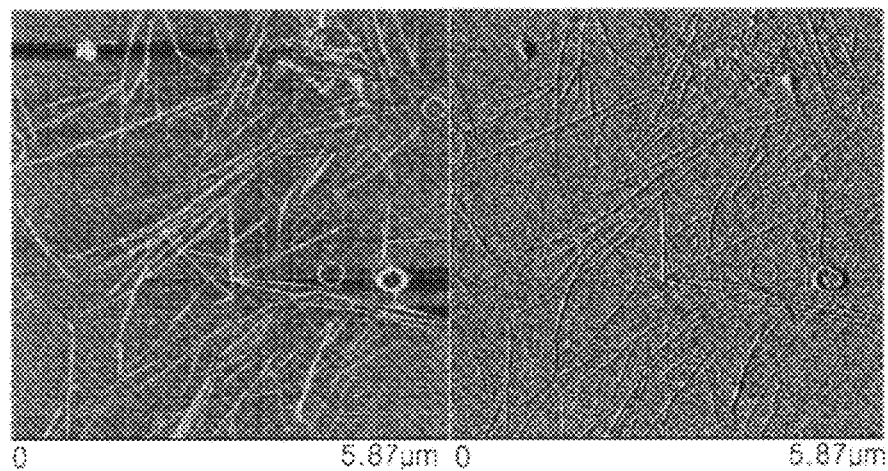
FIG. 3 is an atomic force microscope (AFM) image of a nanostructure-film according to an embodiment of the present invention, wherein the nanostructures comprise substantially few-walled carbon nanotubes.

Referring to FIG. 3, a nanostructure film according to one embodiment of the present invention comprises at least one interconnected network of single-walled carbon nanotubes (SWNTs). Such film may additionally or alternatively comprise other nanotubes (e.g., MWNTs, DWNTs), other fullerenes (e.g., buckyballs), graphene flakes/sheets, and/or nanowires (e.g., metallic (e.g., Ag, Ni, Pt, Au), semiconducting (e.g., InP, Si, GaN), dielectric (e.g., SiO2,TiO2), organic, inorganic).

Such nanostructure film may further comprise at least one functionalization material bonded to the nanostructure film. For example, a dopant bonded to the nanostructure film may increases the electrical conductivity of the film by increasing carrier concentration. Such dopant may comprise at least one of Iodine (I2), Bromine (Br2), polymer-supported Bromine (Br2), Antimonypentafluride (SbF5), Phosphoruspentachloride (PCl5), Vanadiumoxytrifluride (VOF3), Silver(II)Fluoride (AgF2), 2,1,3-Benzoxadiazole-5-carboxylic acid, 2-(4-Biphenylyl)-5-phenyl-1,3,4-oxadiazole, 2,5-Bis-(4-aminophenyl)-1,3,4-oxadiazole, 2-(4-Bromophenyl)-5-phenyl-1,3,4-oxadiazole, 4-Chloro-7-chlorosulfonyl-2,1,3-benzoxadiazole, 2,5-Diphenyl-1,3,4-oxadiazole, 5-(4-Methoxyphenyl)-1,3,4-oxadiazole-2-thiol, 5-(4-Methylphenyl)-1,3,4-oxadiazole-2-thiol, 5-Phenyl-1,3,4-oxadiazole-2-thiol, 5-(4-Pyridyl)-1,3,4-oxadiazole-2-thiol, Methyl viologen dichloride hydrate, Fullerene-C60, N-Methylfulleropyrrolidine, N,N-Bis(3-methylphenyl)-N,N'-diphenylbenzidine, Triethylamine (TEA), Triethanolanime (TEA)-OH, Trioctylamine, Triphenylphosphine, Trioctylphosphine, Triethylphosphine, Trinapthylphosphine, Tetradimethylaminoethene, Tris(diethylamino)phosphine, Pentacene, Tetracene, N,N'-Di-[(1-naphthyl)-N,N-diphenyl]-1,1'-biphenyl)-4,4'-diamine sublimed grade, 4-(Diphenylamino)benzaldehyde, Di-p-tolylamine, 3-Methyldiphenylamine, Triphenylamine, Tris[4-(diethylamino)phenyl]amine, Tri-p-tolylamine, Acradine Orange base, 3,8-Diamino-6-phenylphenanthridine, 4-(Diphenylamino) benzaldehyde diphenylhydrazone, Poly(9-vinylcarbazole), Poly(1-vinylnaphthalene), Poly(2-vinylpyridine)n-oxide, Triphenylphosphine, 4-Carboxybutyl)triphenylphosphonium bromide, Tetrabutylammonium benzoate, Tetrabutylammonium hydroxide 30-hydrate, Tetrabutylammonium tri-iodide, Tetrabutylammonium bis-trifluoromethanesulfonimidate, Tetraethylammonium trifluoromethanesulfonate, Oleum (H2SO4-SO3), Triflic acid and/or Magic Acid.

Such dopant may be bonded covalently or noncovalently to the film. Moreover, the dopant may be bonded directly to the film or indirectly through and/or in conjunction with another molecule, such as a stabilizer that reduces desorption of dopant from the film. The stabilizer may be a relatively weak reducer (electron donor) or oxidizer (electron acceptor), where the dopant is a relatively strong reducer (electron donor) or oxidizer (electron acceptor) (i.e., the dopant has a greater doping potential than the stabilizer). Additionally or alternatively, the stabilizer and dopant may comprise a Lewis base and Lewis acid, respectively, or a Lewis acid and Lewis base, respectively. Exemplary stabilizers include, but are not limited to, aromatic amines, other aromatic compounds, other amines, imines, trizenes, boranes, other boron-containing compounds and polymers of the preceding compounds. Specifically, poly(4-vinylpyridine) and/or tri-phenyl amine have displayed substantial stabilizing behavior in accelerated atmospheric testing (e.g., 1000 hours at 65° C. and 90% relative humidity).

Stabilization of a dopant bonded to a nanostructure film may also or alternatively be enhanced through use of an encapsulant. The stability of a non-functionalized or otherwise functionalized nanostructure film may also be enhanced through use of an encapsulant. Accordingly, yet another embodiment of the present invention comprises a nanostructure film coated with at least one encapsulation layer. This encapsulation layer preferably provides increased stability and environmental (e.g., heat, humidity and/or atmospheric gases) resistance. Multiple encapsulation layers (e.g., having different compositions) may be advantageous in tailoring encapsulant properties. Exemplary encapsulants comprise at least one of a fluoropolymer, acrylic, silane, polyimide and/or polyester encapsulant (e.g., PVDF (Hylar CN, Solvay), Teflon AF, Polyvinyl fluoride (PVF), Polychlorotrifluoroethylene (PCTFE), Polyvinylalkyl vinyl ether, Fluoropolymer dispersion from Dupont (TE 7224), Melamine/Acrylic blends, conformal acrylic coating dispersion, etc.). Encapsulants may additionally or alternatively comprise UV and/or heat cross-linkable polymers (e.g., Poly(4-vinyl-phenol)).

A nanostructure film according to one embodiment may also comprise application-specific additives. For example, thin nanotube films can be inherently transparent to infrared radiation, thus it may be advantageous to add an infrared (IR) absorber thereto to change this material property (e.g., for window shielding applications). Exemplary IR absorbers include, but are not limited to, at least one of a cyanine, quinone, metal complex, and photochronic. Similarly, UV absorbers may be employed to limit the nanostructure film's level of direct UV exposure.

A nanostructure film according to one embodiment may be fabricated using solution-based processes. In such processes, nanostructures may be initially dispersed in a solution with a solvent and dispersion agent. Exemplary solvents include, but are not limited to, deionized (DI) water, alcohols and/or benzo-solvents (e.g., tolulene, xylene). Exemplary dispersion agents include, but are not limited to, surfactants (e.g., sodium dodecyl sulfate (SDS), Triton X, NaDDBS) and biopolymers (e.g., carboxymethylcellulose (CMC)). Dispersion may be further aided by mechanical agitation, such as by cavitation (e.g., using probe and/or bath sonicators), shear (e.g., using a high-shear mixer and/or rotor-stator), impingement (e.g., rotor-stator) and/or homogenization (e.g., using a homogenizer). Coating aids may also be employed in the solution to attain desired coating parameters, e.g., wetting and adhesion to a given substrate; additionally or alternatively, coating aids may be applied to the substrate. Exemplary coating aids include, but are not limited to, aerosol OT, fluorinated surfactants (e.g., Zonyl FS300, FS500, FS62A), alcohols (e.g., hexanol, heptanol, octanol, nonanol, decanol, undecanol, dodecanol, saponin, ethanol, propanol, butanol and/or pentanol), aliphatic amines (e.g., primary, secondary (e.g., dodecylamine), tertiary (e.g., triethanolamine), quartinary), TX-100, FT248, Tergitol TMN-10, Olin 10G and/or APG325.

The resulting dispersion may be coated onto a substrate using a variety of coating methods. Coating may entail a single or multiple passes, depending on the dispersion properties, substrate properties and/or desired nanostructure film properties. Exemplary coating methods include, but are not limited to, spray-coating, dip-coating, drop-coating and/or casting, roll-coating, transfer-stamping, slot-die coating, curtain coating, [micro]gravure printing, flexoprinting and/or inkjet printing. Exemplary substrates may be flexible or rigid, and include, but are not limited to, glass, elastomers (e.g., saturated rubbers, unsaturated rubbers, thermoplastic elastomers (TPE), thermoplastic vulcanizates (TPV), polyurethane rubber, polysulfide rubber, resilin and/or elastin) and/or plastics (e.g., polymethyl methacrylate (PMMA), polyolefin(s), polyethylene terephthalate (PET), polyethylene naphthalate (PEN), polycarbonate (PC), polyethersulfone (PES) and/or Arton). Flexible substrates may be advantageous in having compatibility with roll-to-roll (a.k.a. reel-to-reel) processing, wherein one roll supports uncoated substrate while another roll supports coated substrate. As compared to a batch process, which handles only one component at a time, a roll-to-roll process represents a dramatic deviation from current manufacturing practices, and can reduce capital equipment and product costs, while significantly increasing throughput. Nanostructure films may be printed first on a flexible substrate, e.g., to take advantage of roll-to-roll capabilities, and subsequently transferred to a rigid substrate (e.g., where the flexible substrate comprises a release liner, laminate and/or other donor substrate or adhesion layer (e.g., A-187, AZ28, XAMA, PVP, CX-100, PU)).

Once coated onto a substrate, the dispersion may be heated to remove solvent therefrom, such that a nanostructure film is formed on the substrate. Exemplary heating devices include a hot plate, heating rod, heating coil and/or oven. The resulting film may be subsequently washed (e.g., with water, ethanol and/or IPA) and/or oxidized (e.g., baked and/or rinsed with an oxidizer such as nitric acid, sulfuric acid and/or hydrochloric acid) to remove residual dispersion agent and/or coating aid therefrom.

Dopant, other additives and/or encapsulant may further be added to the film. Such materials may be applied to the nanostructures in the film before, during and/or after film formation, and may, depending on the specific material, be applied in gas, solid and/or liquid phase (e.g., gas phase NO2 or liquid phase nitric acid (HNO3) dopants). Such materials may moreover be applied through controlled techniques, such as the coating techniques enumerated above in the case of liquid phase materials (e.g., slot-die coating a polymer encapsulant).

A nanostructure film according to one embodiment may be patterned before (e.g., using lift-off methods, pattern-pretreated substrate), during (e.g., patterned transfer printing, inkjet printing) and/or after (e.g., using laser ablation or masking/etching techniques) fabrication on a substrate.

In one exemplary embodiment, an optically transparent and electrically conductive nanostructure film comprising an interconnected network of SWNTs was fabricated on a transparent and flexible plastic substrate via a multi-step spray and wash process. A SWNT dispersion was initially formulated by dissolving commercially-available SWNT powder (e.g., P3 from Carbon Solutions) in DI water with 1% SDS, and probe sonicated for 30 minutes at 300 W power. The resulting dispersion was then centrifuged at 10k rcf (relative centrifugal field) for 1 hour, to remove large agglomerations of SWNTs and impurities (e.g., amorphous carbon and/or residual catalyst particles). In parallel, a PC substrate was immersed in a silane solution (a coating aid comprising 1% weight of 3-aminopropyltriethoxysilane in DI water) for approximately five minutes, followed by rinsing with DI water and blow drying with nitrogen. The resulting pretreated PC substrate (Tekra 0.03" thick with hard coating) was then spray-coated over a 100° C. hot plate with the previously-prepared SWNT dispersion, immersed in DI water for 1 minute, then sprayed again, and immersed in DI water again. This process of spraying and immersing in water may be repeated multiple times until a desired sheet resistance (e.g., film thickness) is achieved.

In a related exemplary embodiment, a doped nanostructure film comprising an interconnected network of SWNTs was fabricated on a transparent and flexible substrate using the methods described in the previous example, but with a SWNT dispersion additionally containing a TCNQF4 dopant. In another related embodiment, this doped nanostructure film was subsequently encapsulated by spin-coating a layer of parylene thereon and baking.

In another exemplary embodiment, a SWNT dispersion was first prepared by dissolving SWNT powder (e.g., P3 from Carbon Solutions) in DI water with 1% SDS and bath-sonicated for 16 hours at 100 W, then centrifuged at 15000 rcf for 30 minutes such that only the top ¾ portion of the centrifuged dispersion is selected for further processing. The resulting dispersion was then vacuum filtered through an alumina filter with a pore size of 0.1-0.2 μm (Watman Inc.), such that an optically transparent and electrically conductive SWNT film is formed on the filter. DI water was subsequently vacuum filtered through the film for several minutes to remove SDS. The resulting film was then transferred to a PET substrate by a PDMS (poly-dimethylsiloxane) based transfer printing technique, wherein a patterned PDMS stamp is first placed in conformal contact with the film on the filter such that a patterned film is transferred from the filter to the stamp, and then placed in conformal contact with the PET substrate and heated to 80° C. such that the patterned film is transferred to the PET. In a related exemplary embodiment, this patterned film may be subsequently doped via immersion in a gaseous NO2 chamber. In another related exemplary embodiment, the film may be encapsulated by a layer of PMPV, which, in the case of a doped film, can reduce desorption of dopant from the film.

In yet another exemplary embodiment, an optically transparent, electrically conductive, doped and encapsulated nanostructure film comprising an interconnected network of FWNTs was fabricated on a transparent and flexible substrate. CVD-grown FWNTs (OE grade from Unidym, Inc.) were first dissolved in DI water with 0.5% Triton-X, and probe sonicated for one hour at 300 W power. The resulting dispersion was then slot-die coated onto a PET substrate, and baked at about 100° C. to evaporate the solvent. The Triton-X was subsequently removed from the resulting FWNT film by immersing the film for about 15-20 seconds in nitric acid (10 molar). Nitric acid may be effective as both an oxidizing agent for surfactant removal, and a doping agent as well, improving the sheet resistance of the film from 498 ohms/sq to about 131 ohms/sq at about 75% transparency, and 920 ohms/sq to about 230 ohms/sq at 80% transparency in exemplary films. In related exemplary embodiments, these films were subsequently coated with triphenylamine which stabilized the dopant (i.e., the film exhibited a less than 10% change in conductivity after 1000 hours under accelerated aging conditions (65° C.)). In other related exemplary embodiments, the films were then encapsulated with Teflon AF.

In another exemplary embodiment, FWNT powder was initially dispersed in water with SDS (e.g., 1%) surfactant by sonication (e.g., bath sonication for 30 minutes, followed by probe sonication for 30 minutes); 1-dodecanol (e.g., 0.4%) was subsequently added to the dispersion by sonication (e.g., probe sonication for 5 minutes) as a coating aid, and the resulting dispersion was Meyer rod coated onto a PEN substrate. SDS was then removed by rinsing the film with DI water, and the 1-dodecanol was removed by rinsing with ethanol. This resulting optically transparent and electrically conductive films passed an industry-standard "tape test," (i.e., the FWNT film remained on the substrate when a piece of Scotch tape was pressed onto and then peeled off of the film); such adhesion between the FWNT film and PEN was not achieved with SDS dispersions absent use of a coating aid.

Figure 1:
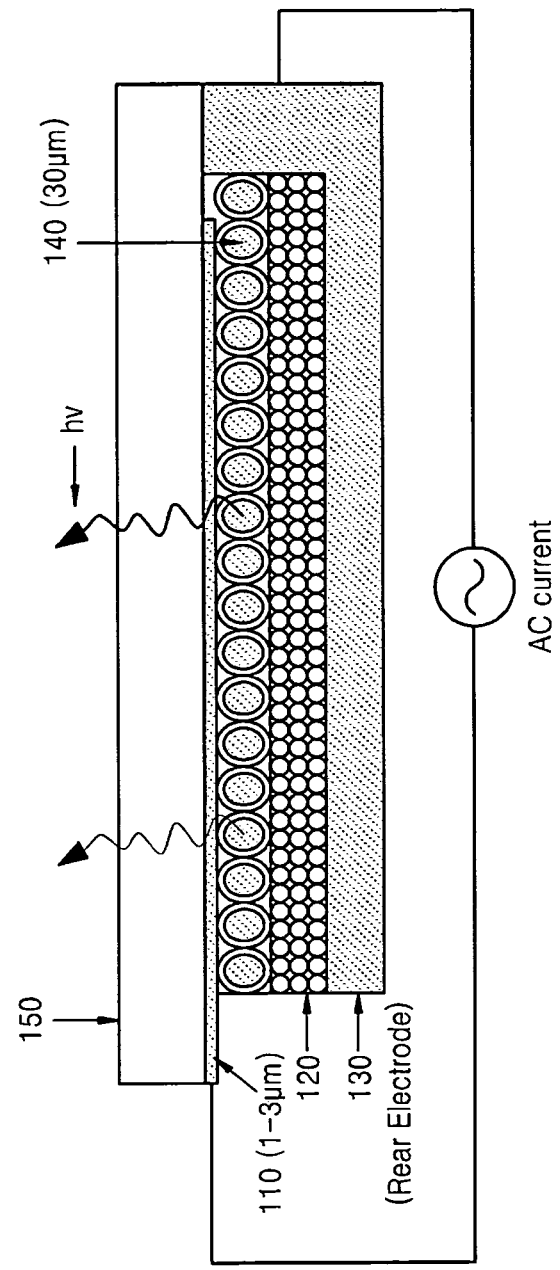
FIG. 1 is a schematic representation of an electroluminescent (EL) device according to an embodiment of the present invention.

Referring to FIG. 1, an electroluminescent (EL) device (e.g., phosphor-based EL lamp) according to an embodiment of the present invention separates electrons and holes through excitation by impact of high-energy electrons accelerated by a strong electric field. This device may comprise an EL material 140 (e.g., zinc sulfide with small amounts of impurities such as copper, silver and/or manganese) sandwiched between at least two electrodes, at least one of which 110 is at least semi-transparent so as to allow photons emitted from the EL material 140 to pass through. The at least semi-transparent electrode preferably comprises at least one nanostructure-film 110 that may be deposited on a transparent substrate 150, while the other electrode 130 may comprise a non-transparent material.

In one embodiment of the present invention, nanostructures may additionally or alternatively be intercalated (in whole or in part) with EL material 140, and/or vice versa. By tailoring the relative amounts of nanostructures and EL material 140, a composite may be formed wherein the nanostructures form an interconnected network. A nanostructure film may be formed first and subsequently intercalated with EL material, e.g., wherein EL material fills open porosity in the nanostructure film. Alternatively, nanostructures may be mixed with EL material in solution, and then deposited as a composite (e.g., by spin-coating).

One embodiment of the present invention may further comprise an alternating current (AC) source attached to the electrodes 110 130, so as to produce a changing electric field between the electrodes. AC thin-film devices according to embodiments of the present invention (e.g., as described above) may be essentially parallel plate capacitors, wherein the electric field found inside the capacitor excites phosphors in the EL material 140, causing it to emit light.

For example, an electric field can drive electrons in a phosphor particle comprising ZnS:Mn, causing these electrons to slam into and thereby excite manganese atoms in the phosphor. These manganese atoms subsequently relax from their excited states by emitting visible photons (light). Note: a direct current source may be used as well or instead.

The aforementioned driving of electrons is proportional to the electric field between device electrodes, which in turn is proportional to the applied voltage and inversely proportional to the electrode separation. A dielectric layer 120 may be used to even out the electric field, reflect light from the EL material, and/or prevent the capacitor from shorting (e.g., where brightness is optimized by decreasing plate separation). Another dielectric layer may also be included between the EL material 140 and nanostructure-film 110.

Figure 2:
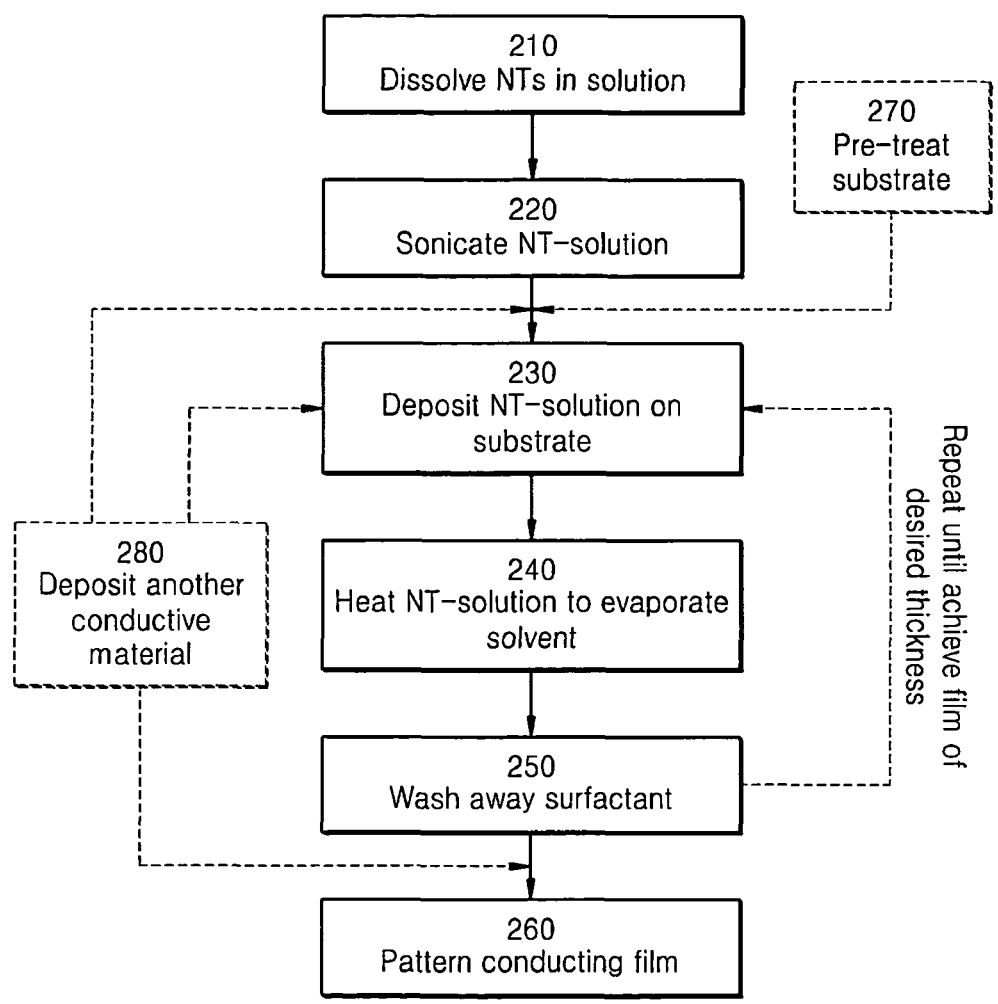
FIG. 2 is a flow-chart describing a nanostructure-film electrode fabrication method according to embodiments of the present invention.

Referring to FIG. 2, a method of fabricating an EL device according to preferred embodiments of the present invention comprises first forming a nanostructure-film and depositing it on a transparent substrate.

For example, a nanostructure-film comprising a network of substantially carbon nanotubes (e.g., SWNTs, FWNTs, MWNTs) may be fabricated by first dissolving 210 and dispersing water soluble carbon nanotube powder (e.g., P3 arc-discharged SWNT powder from Carbon Solutions, Inc.) in solution (e.g., distilled oxide (DI) water) with surfactants (e.g., Triton-X), and subsequently sonicating 220 the solution (e.g., bath sonication at 100 W for 2 hours). As used herein, "substantially" shall mean that at least 40% of components are of a given type.

The resulting well-dispersed and stable solution may be deposited 230 onto a substrate using a number of different methods, including, but not limited to, spray-coating, dip-coating, drop-coating and/or casting, roll-coating, transfer-stamping and/or inkjet printing. A Meyer rod may be used to squeeze the solutions for a more uniform nanostructure solution coating.

In a preferred fabrication method, SWNTs are deposited using a transfer stamping method, wherein the above-prepared SWNT solution is vacuum filtered (e.g., over a porous alumina membrane) and dried to produce at least one SWNT network. Following drying, the SWNT network(s) is lifted off the filter with a poly(dimethylsiloxane) (PDMS) stamp and transferred to a substrate (e.g., glass, polyethylene terephthalate (PET), polyethylene naphthalate (PEN), polycarbonate (PC), polyethersulfone (PES) and/or Arton). Conformal contact between the stamp and the SWNT network(s) on the filter induces wetting, which transfers the SWNT network(s) from the filter to the stamp. Subsequent heating (e.g., for 10 minutes at 80° C.) of the stamp transfers the FWNT network(s) from the stamp to the substrate. Both the filter and stamp can be reused for additional filtration and transfer printing cycles. Depending on the surfactant and substrate used, the substrate may require pre-treatment 270.

Transfer stamping has the added advantage of allowing deposition of patterned films (e.g., where the PDMS stamp is already patterned). Additionally or alternatively, the nanostructure-film may be patterned before (e.g., transfer stamping), during (e.g., inkjet printing) and/or after (e.g., photolithography, etching and/or liftoff) deposition.

In another fabrication method according to the present invention, network(s) of substantially FWNTs (e.g., as described by Liu et al. in U.S. patent application Ser. No. 11/012,341, now U.S. Pat. No. 7,618,300) may be deposited by dip-coating, wherein a substrate is dipped into a FWNT solution (e.g., prepared in substantially the same way as the SWNT solution above), the former having been treated and/or matched with an appropriate surfactant such that a layer of solution coats the substrate surface. Solvent may be subsequently evaporated 240 from the solution, preferably in a uniform manner using, for example, a flash-drying method (where evaporation begins on one side of the substrate, and sweeps across the substrate in a "drying wave"). Heat can be applied in various manners, e.g., by linear heating bar or infrared laser. Additionally, solvent evaporation may be aided by air-flow blow drying.

Where a surfactant is used, the substrate will preferably undergo a subsequent wash 250 to remove surfactant from the dried nanostructure-film on the substrate. Washing may comprise rinsing the film with water and/or methanol, and then drying it with air-flow blow dry or heat.

Generally, deposition cycles (e.g., depositing, heating and/or washing) can be repeated until a nanostructure-film of desired thickness is achieved. Thicker films have a lower sheet resistance (i.e., higher electrical conductivity) and optical transmittance (i.e., less light can pass through) than thinner films, thus film performance can be tailored to given device requirements. The nanostructure-films described herein are applicable to non-transparent, semi-transparent and/or transparent electrodes.

Another material may also be deposited 280 with the nanostructure network(s), such as a polymer. This material may be electrically conductive, and may form a distinct layer on top of and/or beneath the nanostructure network, preferably filling a plurality of pores in the nanostructure network(s). Moreover, this material preferably serves as a binder, use of which can result in property improvement including environmental resistance and flexibility (e.g., fluorine-containing polymers such as polyvinylidene fluoride (PVDF) has been shown to improve moisture resistance considerably). Additionally or alternatively, the nanostructure solution and other material may be mixed, sonicated (e.g., bath sonicated for 1 hour), deposited onto a substrate (e.g., spin-coated onto a pre-cleaned glass slide at a speed of 1000 rpm), and cured (e.g., over a hotplate at 120 degrees for 18 minutes) to form a composite layer.

Referring to FIG. 3, atomic force microscope (AFM) images evidence an exemplary nanostructure-film produced according to an embodiment of the present invention. This nanostructure-film comprised a network of substantially FWNTs, and displayed relatively high uniformity. Moreover, it performed comparably to films comprising substantially high-quality SWNTs (e.g., P3 arc-discharged SWNTs from Carbon Solutions, Inc.), with a measured sheet resistance ($R_s$) of 112 Ω/sq and an optical transmittance (T) of 63.5% at a wavelength of 550 nm. Thinner and thicker FWNT films performed accordingly, with $R_s$=520 Ω/sq for T=91% and $R_s$=37.1 Ω/sq for T=37.24% respectively.

Once the transparent electrode has been formed, other device layers may be deposited thereon. Such deposition can be as simple as applying, in sequence, thick pastes respectively comprising an EL material (e.g., phosphor-based), dielectric material and conductive electrode material (e.g., silver) onto the transparent electrode surface. These pastes may be applied manually, controlling layer thickness using scotch tape spacers and a spatula, and drying and curing each layer before application of the next (e.g., oven-dried at 130° C. for ~15 minutes). Clearly, more sophisticated deposition techniques may be used without departing from the scope of the present invention (e.g., silk-screening). For example, more specialized equipment may be used to deposit thinner and more uniform dielectric and phosphor layers, while keeping the electrodes electrically separated from each other.

A power source may be connected to the device by attaching one electrical contact to the transparent electrode, and another to the other electrode (e.g., using copper tape). Preferably, and alternating current (AC) voltage (e.g., 60-2000 Hz and 200-300 volts) is used, so as to produce relatively continuous lighting; however a direct current (DC) voltage can also produce a change in electric field (e.g., as the capacitor charges) and corresponding light from the EL material.

In an alternative embodiment, an EL device may be built-up from the optionally non-transparent electrode, e.g., wherein a dielectric layer is deposited on the optionally non-transparent electrode, EL material is deposited on the dielectric, and the nanostructure-film is deposited on the EL material.

The present invention has been described above with reference to preferred features and embodiments. Those skilled in the art will recognize, however, that changes and modifications may be made in these preferred embodiments without departing from the scope of the present invention. These and various other adaptations and combinations of the embodiments disclosed are within the scope of the invention.

What is claimed is:

1. An electroluminescent (EL) device, comprising:
    an EL material including a phosphor material;
    a first electrode; and
    a second electrode, wherein at least one of the first and second electrodes comprises a nanostructure film, the nanostructure film including at least one interconnected network of carbon nanotubes, open porosity in the nanostructure film being filled with the EL material, the nanostructure film having a sheet resistance of less than about 920 ohms/sq.

2. An electroluminescent (EL) device, comprising:
    an EL material including a phosphor material;
    a first electrode; and
    a second electrode, wherein at least one of the first and second electrodes comprises a nanostructure film, the nanostructure film including at least one interconnected network of carbon nanotubes, open porosity in the nanostructure film being filled with the EL material, the nanostructure film having a sheet resistance of less than about 230 ohms/sq.

3. An electroluminescent (EL) device, comprising:
    an EL material including a phosphor material; and
    a first electrode comprising a nanostructure film, the nanostructure film including at least one interconnected network of carbon nanotubes, open porosity in the nanostructure film being filled with the EL material, the interconnected network having a sheet resistance of less than about 920 ohms/sq.

4. The EL device of claim 3, further comprising a second electrode.

* * * * *